United States Patent
Magno et al.

(10) Patent No.: US 8,076,700 B2
(45) Date of Patent: Dec. 13, 2011

(54) P-N JUNCTION FOR USE AS AN RF MIXER FROM GHZ TO THZ FREQUENCIES

(75) Inventors: Richard Magno, Waldorf, MD (US); Mario Ancona, Alexandria, VA (US); John Bradley Boos, Springfield, VA (US); James G Champlain, Alexandria, VA (US); Harvey S Newman, Washington, DC (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 227 days.

(21) Appl. No.: 12/476,298

(22) Filed: Jun. 2, 2009

(65) Prior Publication Data

US 2009/0302352 A1    Dec. 10, 2009

Related U.S. Application Data

(60) Provisional application No. 61/129,188, filed on Jun. 10, 2008.

(51) Int. Cl.
*H01L 29/207* (2006.01)
*H01L 21/203* (2006.01)

(52) U.S. Cl. ............ 257/200; 257/615; 257/E29.093; 257/E21.1; 438/478

(58) Field of Classification Search .......... 257/200, 257/615, E29.093, E21.1; 438/478
See application file for complete search history.

(56) References Cited

U.S. PATENT DOCUMENTS

| | | | | |
|---|---|---|---|---|
| 5,060,030 A | * | 10/1991 | Hoke | 257/194 |
| 6,104,227 A | | 8/2000 | Durec et al. | |
| 7,230,284 B2 | | 6/2007 | Parikh et al. | |
| 7,468,314 B2 | | 12/2008 | Shenoy et al. | |
| 2006/0065952 A1 | * | 3/2006 | Boos et al. | 257/565 |

OTHER PUBLICATIONS

Magno, Glaser, Tinkham, Champlain, Boos, Ancona, Campbell; Narrow Band Gap InGaSb, InAlAsSb Alloys for Electronic Devices; May 31, 2006; 1622 J Vac Sci Technol B 24(3).
Bennett, Boos, et al; InAlSb/InAs/AlGaSb Quantum Well Heterostructures for High-Electron-Mobility Transistors, 2007.
Kruppa, Boos et al; InAs HEMT narrowband amplifier with ultra-low power dissipation; 2006.

\* cited by examiner

*Primary Examiner* — Ngan Ngo
*Assistant Examiner* — Benjamin Tzu-Hung Liu
(74) *Attorney, Agent, or Firm* — Amy L. Ressing; Stephen T. Hunnius

(57) ABSTRACT

This disclosure describes a semiconductor device that can be used as a mixer at RF frequencies extending from a few tens of GHz into the THz frequency range. The device is composed of narrow bandgap semiconductors grown by solid source molecular beam epitaxy. The device can comprise a GaSb substrate, a AlSb layer on the GaSb substrate, a $In_{0.69}Al_{0.31}As_{0.41}Sb_{0.59}$ layer, on the AlSb layer and wherein the $In_{0.69}Al_{0.31}As_{0.41}Sb_{0.59}$ comprises varying levels of Te doping, a $In_{0.27}Ga_{0.73}Sb$ layer on the $In_{0.69}Al_{0.31}As_{0.41}Sb_{0.59}$ layer, wherein the $In_{0.27}Ga_{0.73}Sb$ layer is Be doped, wherein the first section of the $In_{0.69}Al_{0.31}As_{0.41}Sb_{0.59}$ layer has is Te doped, wherein the second section of the $In_{0.69}Al_{0.31}As_{0.41}Sb_{0.59}$ layer has a grade in Te concentration, and wherein the third section of the $In_{0.69}Al_{0.31}As_{0.41}Sb_{0.59}$ layer is Te doped.

22 Claims, 10 Drawing Sheets

P-N JUNCTION FOR USE AS AN RF MIXER FROM GHZ TO THZ FREQUENCIES

This application claims the benefit of U.S. Provisional Patent Application No. 61/129,188 filed on Jun. 10, 2008, the entirety of which is herein incorporated by reference.

This disclosure describes a semiconductor device that can be used as a mixer at RF frequencies extending from a few tens of GHz into the THz frequency range.

The device is composed of narrow bandgap semiconductors grown by solid source molecular beam epitaxy. The narrow bandgaps allows the p-n heterojunction to operate as a mixer with considerably lower local oscillator (LO) power than required by currently available high frequency mixers.

Mixers are used in a large variety of communication and radar systems over a very wide range of frequencies. The narrow bandgap semiconductors used in this p-n heterojunction exhibit very high electron mobilities and very low contact resistances. It is these properties that enable the mixer to operate at THz frequencies.

Currently, there is a great interest in developing electronic devices that work in the THz frequency range for use in cameras for recording images, and in spectroscopic systems for the detection of chemical and biological agents, and a mixer is a critical component in these applications.

Existing semiconductor mixers require a local oscillator signal source to operate, and in some cases a combination of a DC bias and a local oscillator source are used. DC bias sources are not desirable as they introduce noise into the system. In many implementations, using a DC bias will complicate the circuitry as additional wires must be used to connect it to a mixer. The DC interconnect problem becomes particularly difficult in focal plane imaging arrays containing thousands of pixels, as a DC connection is needed for each pixel. At operating frequencies above about 100 GHz, currently available detectors require several milliwatts of local oscillator power. This is a significant problem as small high-power local oscillator sources at these frequencies are not readily available. The lack of readily-integrable sources is an impediment in the development of portable hand-held or space-based systems where weight is a major concern.

This disclosure describes the employment of narrow bandgap semiconductors in the production of the p-n mixer diode, allowing the diode to change its state from a low conductance to high conductance at a very low forward voltage. As a result, the mixer will operate with a low-power local oscillator source, and without a DC bias.

Another aspect is that the use of these semiconductors will introduce smaller parasitic resistances and reactances than what might be obtainable from conventional semiconductors, and thus will function at higher operating frequencies than currently available mixers.

The use of molecular beam epitaxial deposition techniques allows the growth of thin semiconductor layers that result in the short transit times needed for high-speed operation, and is compatible with standard lithographic fabrication processes.

Mixers use the nonlinear current-voltage (I-V) characteristic of a semiconductor diode to frequency-convert an RF signal. As a result of the nonlinear behavior of the diode the signal of interest at frequency $\omega_S$ is multiplied with the local oscillator signal at frequency $\omega_{LO}$ to produce output signals at all the sum and difference frequencies. These intermediate frequencies, $\omega_{IF}$, are easily filtered and amplified for further processing. The most interesting frequencies for applications where $\omega_S$ is in the THz frequency range are often $\omega_{IF} = n\omega_{LO} \pm \omega_S$ where n is an integer. This is particularly true when there are no small light-weight local oscillator sources with adequate power output.

A DC bias voltage may be used to operate at the most desirable part of the diode's I-V characteristic in order to use a low-power local oscillator, but that is often not useful solution. A DC source adds unwanted electronic noise, and there can be problems with filtering and the wire layouts needed to apply the DC bias. These difficulties are multiplied many times when the mixer is to be used in an imaging application where local oscillator power is needed for each of the pixels in an array that may contain several thousand pixels.

This disclosure addresses the local oscillator power deficiency problem by using a new narrow-bandgap heterojunction diode that requires less local oscillator power than required by currently available mixer diodes.

GaAs Schottky barrier diodes currently represent the state-of-the-art in commercially available mixer diodes. The current-voltage characteristic of a diode may be calculated using $J = J_S(e^{qV/\eta KT} - 1)$ where J is the current density (amperes per diode area), V is the applied bias (volts), q the electronic charge (coulombs), $\eta$ the ideality factor, usually ~1, K the Boltzmann factor (joules/Kelvin) T the temperature (Kelvin), and $J_S$ the saturation current density. The saturation current densities reported in the literature for GaAs diodes are in the range of $1 \times 10^{-6}$ A/cm$^2$ or less, which is 4 orders of magnitude smaller than the $1 \times 10^{-2}$ A/cm$^2$ typical saturation current density measured for the $In_{0.27}Ga_{0.73}Sb/In_{0.69}Al_{0.31}As_{0.41}Sbl_{0.59}$ heterojunction diode in this application.

Figure 1:
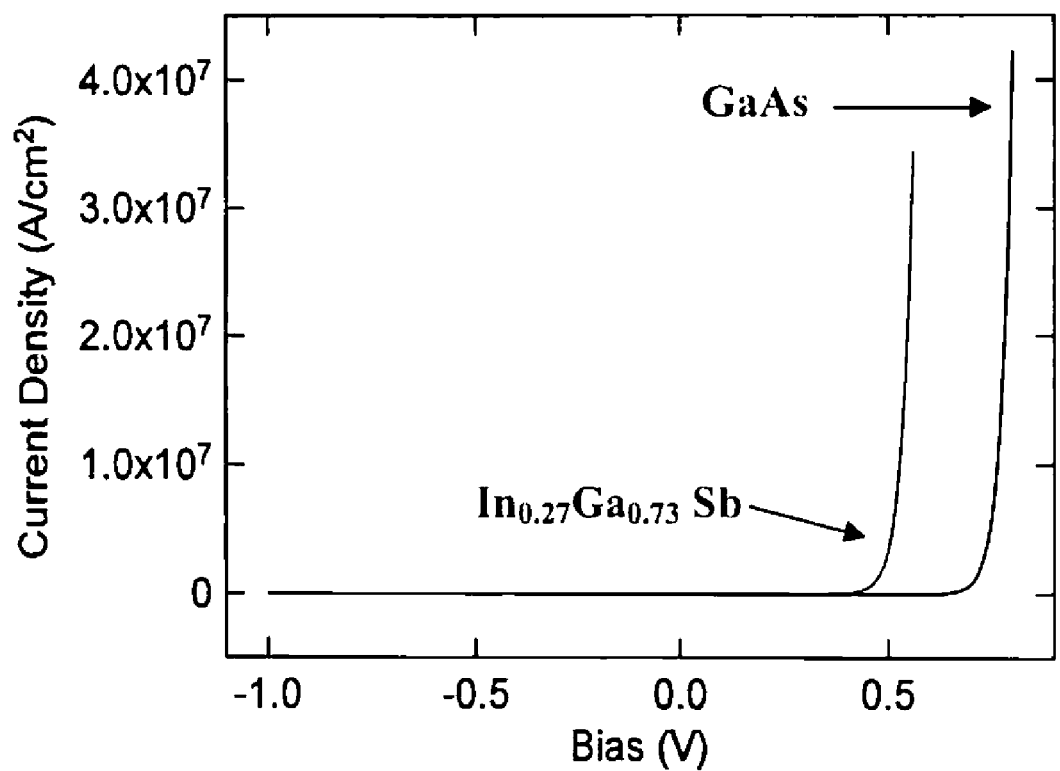
FIG. 1 is a graph illustrating voltage dependence calculated for an ideal diode with the saturation density of the new $In_{0.27}Ga_{0.73}Sb$ diode and a GaAs diode.

The difference between these diodes is illustrated in FIG. 1 where the bias dependence of the current density using this model is plotted for the two diodes. An aspect to note is that the $In_{0.27}Ga_{0.73}Sb$ diode reaches a given forward bias current at a much lower bias than a GaAs diode. A figure of merit is the bias where the current density is 1 μA/μm$^2$ or $10^2$ A/cm$^2$ which is 0.23 V for the $In_{0.27}Ga_{0.73}Sb$ and 0.47 V, or twice as much, for the GaAs Schottky diode. This translates into the $In_{0.27}Ga_{0.73}Sb$ diode operating at lower local oscillator power than a GaAs diode.

Figure 2:
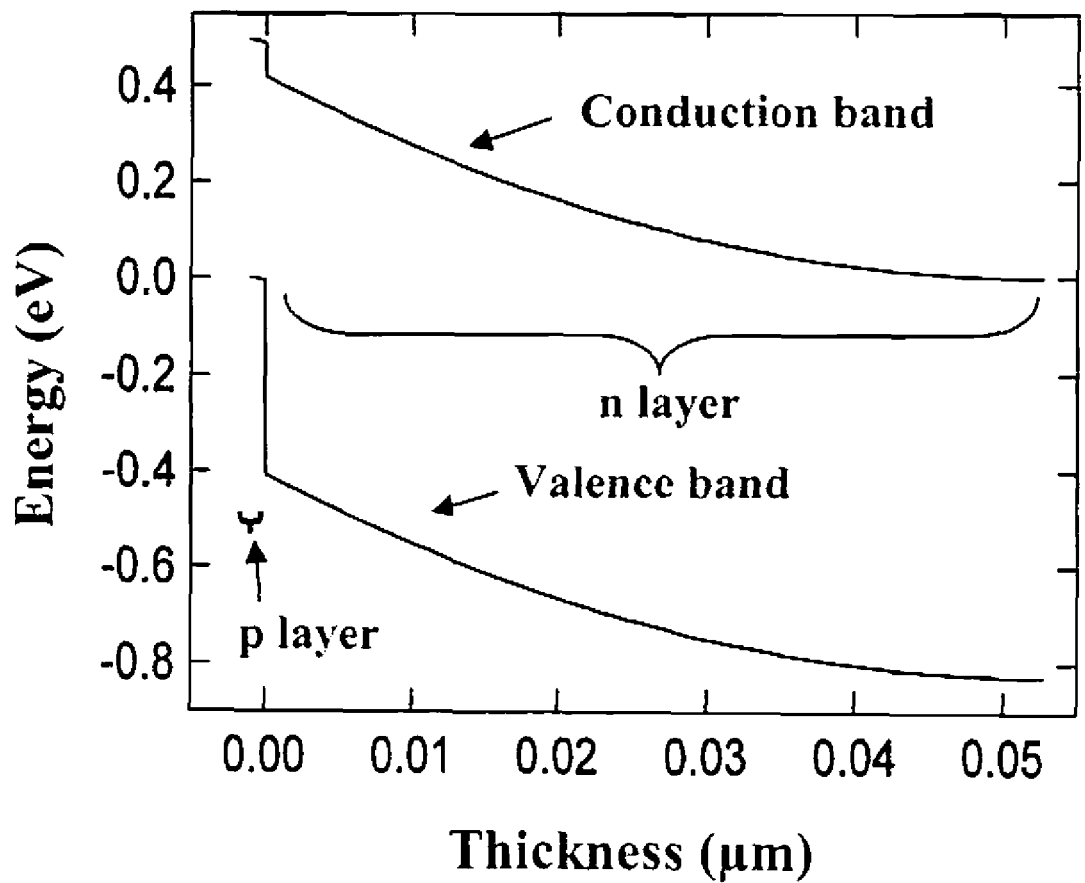
FIG. 2 is a graph illustrating the energy band structure for a p-type $In_zGa_{1-z}Sb/In_xAl_{1-x}As_ySb_{1-y}$ diode. z=0.27, x=0.69, y=0.41 for the diode in FIG. 4.

While the diode illustrated here uses a pair of semiconductors with the $In_{0.27}Ga_{0.73}Sb/In_{0.69}Al_{0.31}As_{0.41}Sbl_{0.59}$ composition with a lattice constant of 6.2 Å many other compositions are possible. The bandgap of the $In_zGa_{1-z}Sb$ alloy decreases as the indium fraction increases from z=0.27, and these even narrower bandgap diodes would require even lower local oscillator power levels The bandgap for the $In_zGa_{1-z}Sb$ heterojunction diode is illustrated in FIG. 2. It is composed of a very thin p-type $In_zGa_{1-z}Sb$ layer and a thicker n-type $In_xAl_{1-x}As_ySb_{1-y}$ layer.

A large saturation current density is required to have a mixer that will operate with a low power-local oscillator source. The saturation current density for this heterojunction is largely set by the bandgap of the $In_zGa_{1-z}Sb$ layer. The structure reported here has z=0.27 and a bandgap of 0.5 eV.

Larger saturation current densities can be obtained by using a larger In concentration in the p layer to obtain a smaller bandgap. It may be necessary to have the same lattice constant in both the n and p layers of the heterostructure. This can be accomplished by adjusting the composition of the $In_xAl_{1-x}As_ySb_{1-y}$ n layer to have the same lattice constant as the $In_zGa_{1-z}Sb$ being used.

For a given lattice constant, the bandgap of the $In_xAl_{1-x}As_ySb_{1-y}$ layer may be adjusted by varying both the In/Al and As/Sb concentrations. This is useful in adjusting the conduction band offset between the $In_zGa_{1-z}Sb$ layer and the $In_xAl_{1-x}As_ySb_{1-y}$ layer. The conduction band offset between the $In_zGa_{1-z}Sb$ and $In_xAl_{1-x}As_ySb_{1-y}$ is a parameter that may be adjusted to obtain optimum performance.

EXAMPLE

Figure 3:
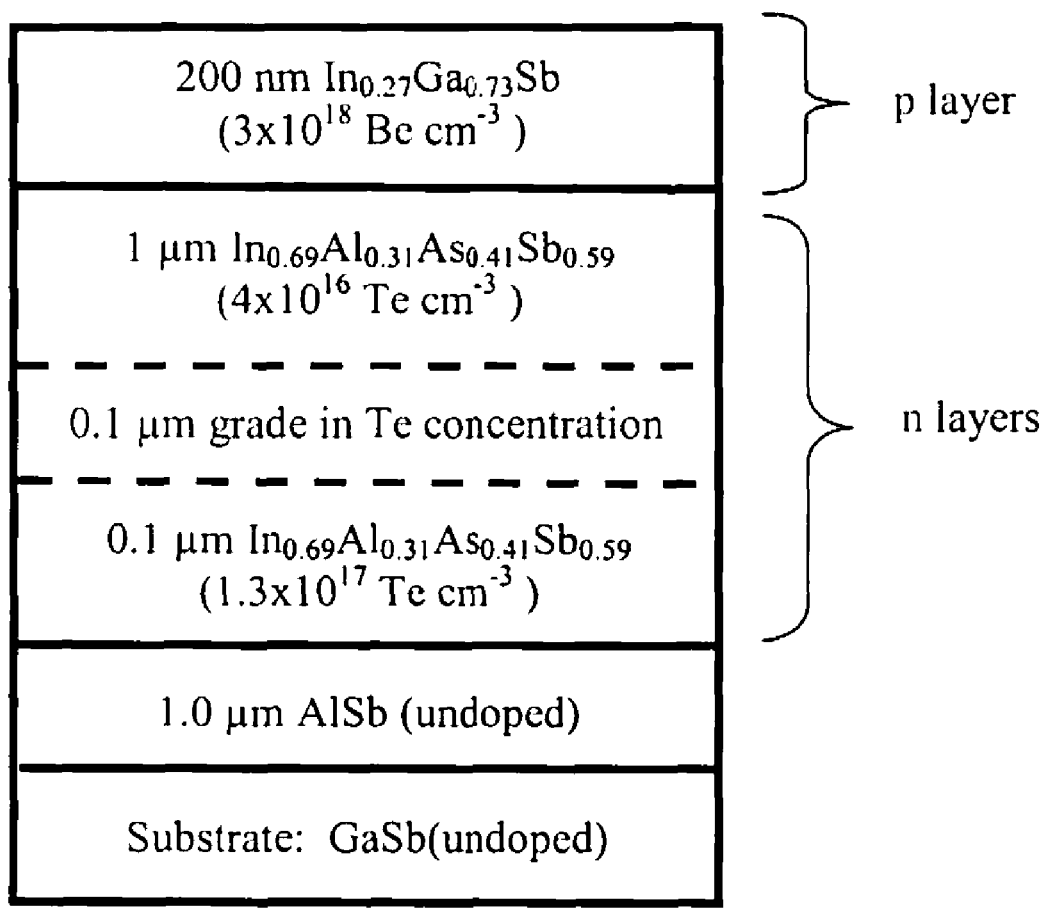
FIG. 3 illustrates a diode layer structure.

A version of the diode with the energy band structure shown in FIG. 2, has been grown and tested and the complete layer structure is shown in FIG. 3. The AlSb layer has a lattice constant of 6.1355 Å and helps to accommodate the lattice mismatch between the GaSb substrate with a 6.0954 Å lattice constant and the p-n layers with a 6.2 Å lattice constant.

A 1.2 μm thick $In_{0.69}Al_{0.31}As_{0.41}Sb_{0.59}$ layer is used to allow the strain due to growing it on an AlSb layer to relax before forming the p-n junction.

Figure 4:
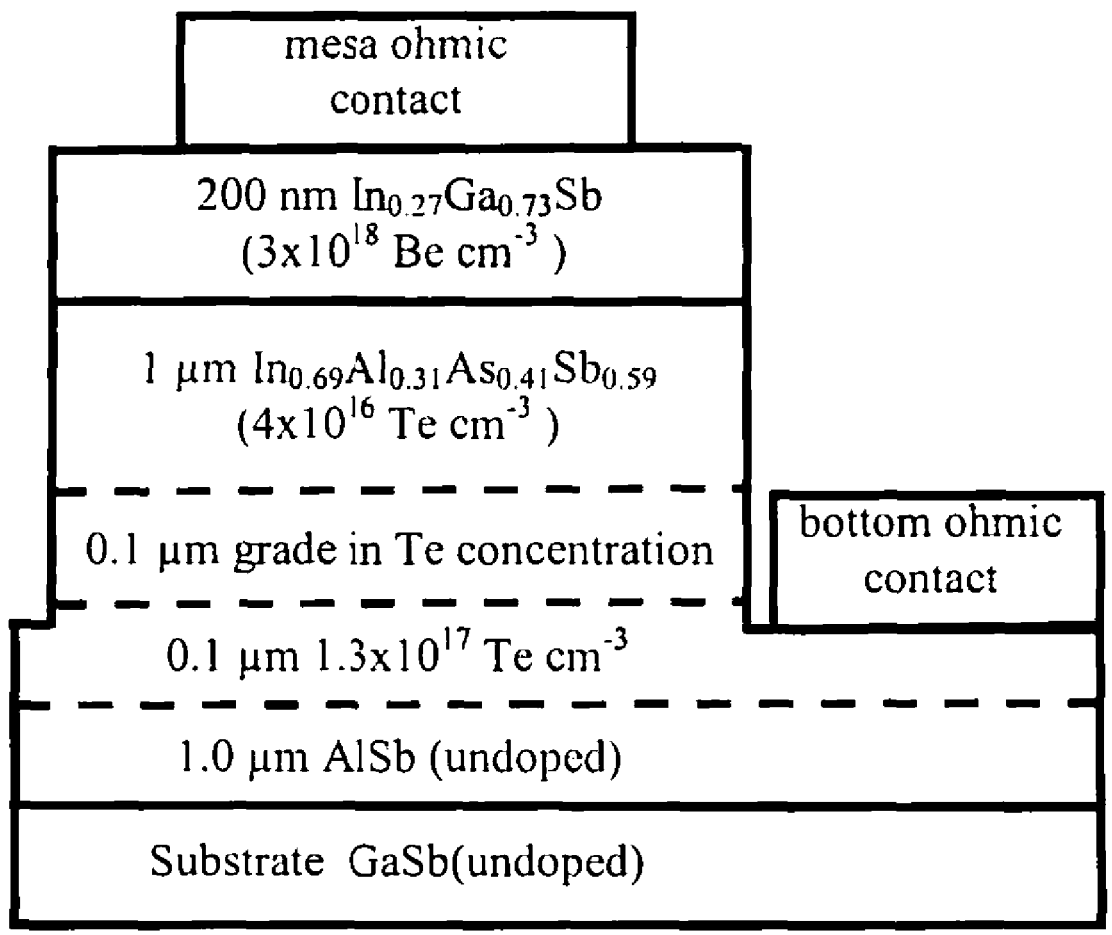
FIG. 4 illustrates a diode mesa schematic.

The bottom 0.1 μm of the $In_{0.69}Al_{0.31}As_{0.41}Sb_{0.59}$ layer is more heavily doped to provide a low resistance path between the p-n region and the bottom ohmic contact metallization illustrated by the mesa schematic shown in FIG. 4.

The Te concentration is graded through a 0.1 μm $In_{0.69}Al_{0.31}As_{0.41}Sb_{0.59}$ to the concentration desired for the n layer part of the junction. The $In_{0.69}Al_{0.31}As_{0.41}Sb_{0.59}$ layer is designed to have a bandgap of about 0.8 eV with a valence band offset near 350 meV according to work by Glisson and et al and Vurgaftman et al. According to the same work, the 0.2 μm $In_{0.27}Ga_{0.73}Sb$ p-type layer has a bandgap near 0.5 eV.

The p layer has been placed on top of the n layer in this structure as this is expected to result in a better definition of the doping profile with little intermixing.

Figure 5:
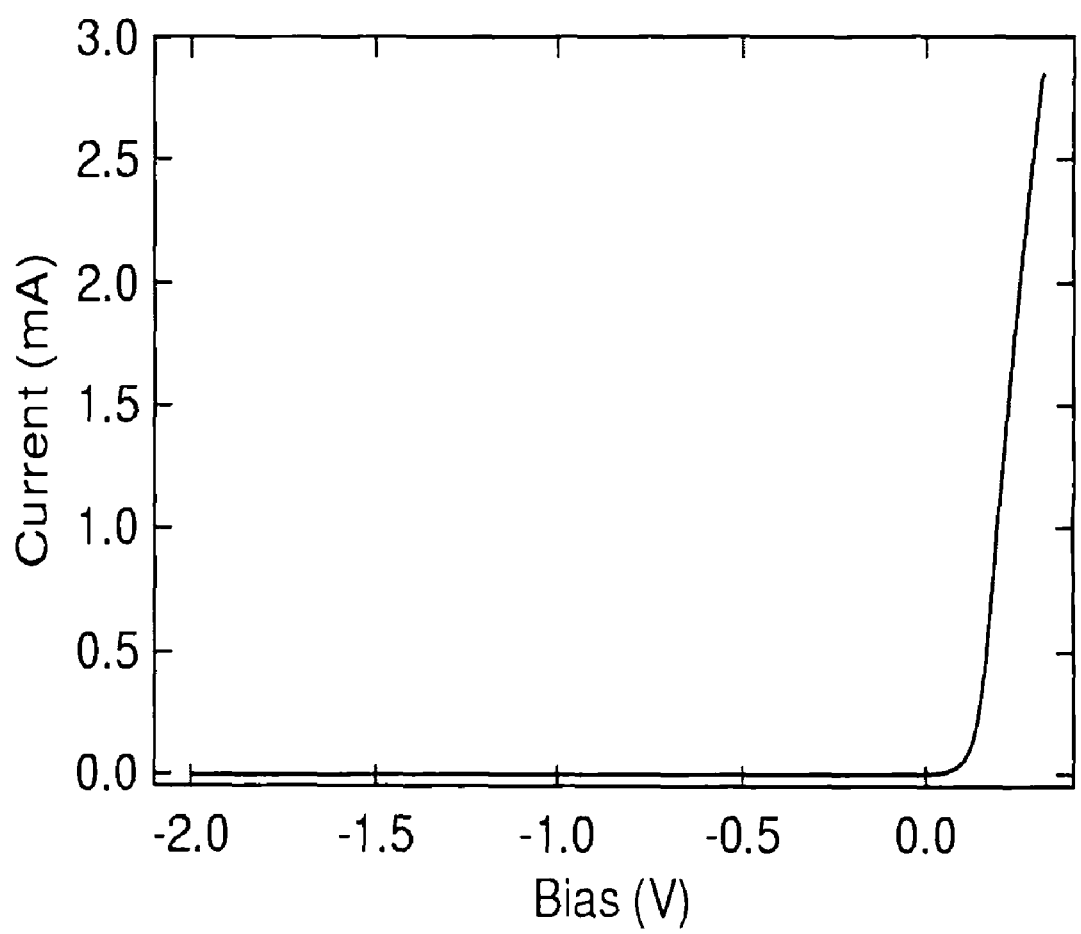
FIG. 5 illustrates current-voltage characteristics of the p-n junction.

The I-V data for a square mesa diode 55 μm on and edge is shown in FIG. 5. The forward current reaches a current density of one $\mu A/\mu m^2$ at 0.25 V, which is low compared to GaAs diodes as illustrated in FIG. 1.

The diode has an ideality factor. η, near one indicating that high quality semiconductor material was used to form the p-n junction.

The low currents found at several volts reverse bias are another indication that the diode is made of good quality semiconductor material.

Figure 6:
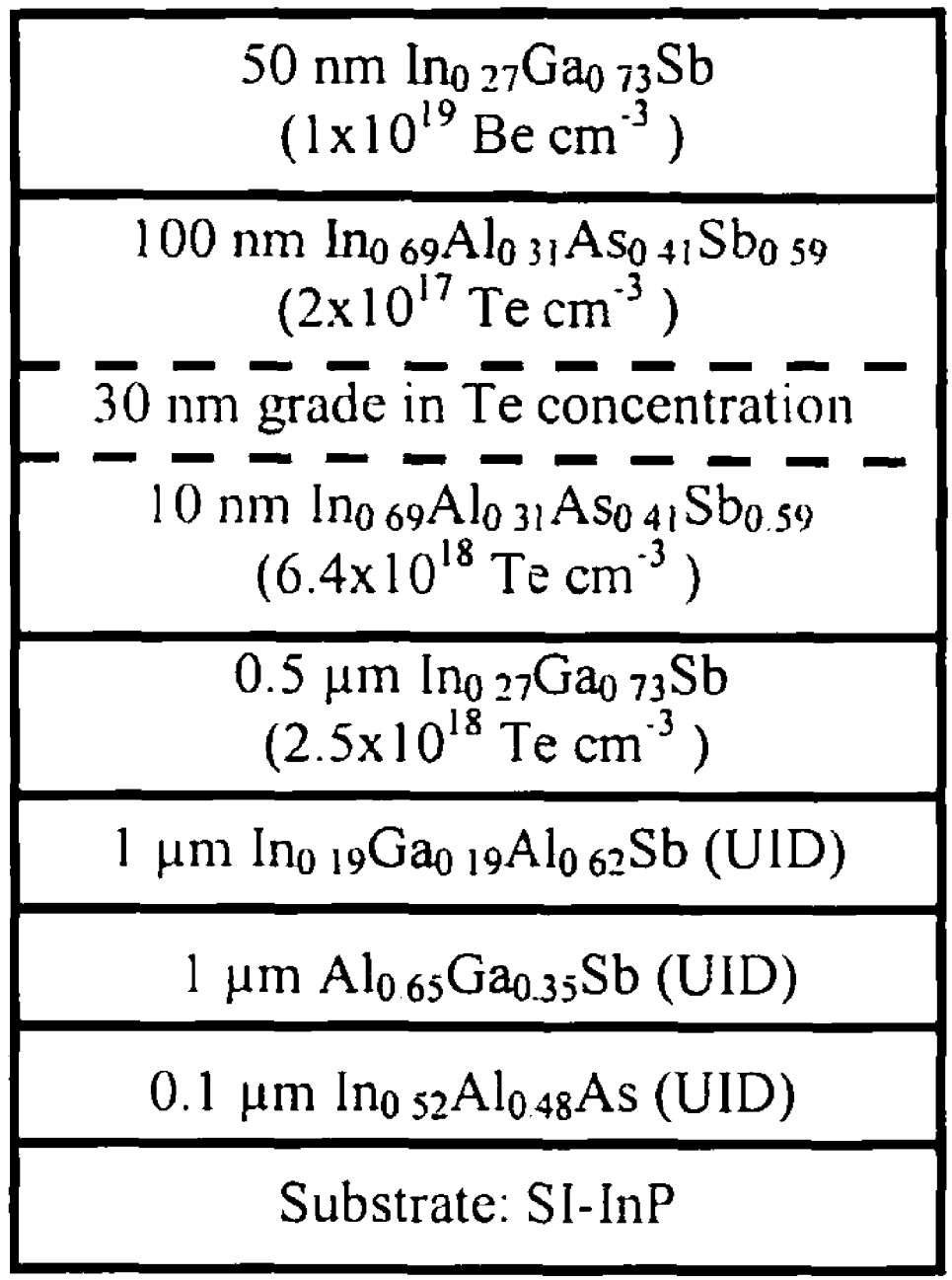
FIG. 6 illustrates an improved diode layer structure with SI—InP substrate.

Similar diodes with the improved layer structure illustrated in FIG. 6 and using advanced lithography to obtain 5 μm diameter diodes also have the high saturation current density illustrated here and η~1. A series resistance, $R_s$, of four ohms and a zero bias capacitance of $C_0$=23 Ff have been measured for these small diodes. These results are used to calculate a cutoff frequency of $1/2\pi R_s C_0$=1.7 THz for these diodes. This is close to the cutoff frequencies found for GaAs mixer diodes, and is expected to increase with improvements in device design and material quality.

This improved diode structure uses an InP substrate that is semi-insulating unlike the GaSb substrate in FIG. 3. Using a semi-insulating substrate allows the development of complex circuits needing electrically isolated devices on a single substrate.

The InP substrate has a lattice constant of 5.869 Å that requires a more complex buffer layer structure composed of $In_{0.52}Al_{0.48}As$ that is lattice matched to InP. This layer is used to smooth the starting InP surface and to transition from a phosphorus based semiconductor to an arsenic based one. The $Al_{0.65}Ga_{0.35}Sb$ layer has a 6.122 Å lattice constant and is used to grade toward the 6.2 Å lattice constant of the p-n junction. The $In_{0.19}Ga_{0.19}Al_{0.62}Sb$ layer has a 6.2 Å lattice constant and is used to complete the transition from the InP substrate lattice constant to the 6.2 Å lattice constant of junction layers.

The $Al_{0.65}Ga_{0.35}Sb$ and $In_{0.19}Ga_{0.19}Al_{0.62}Sb$ layers have high resistivities that will allow device isolation in complex circuits.

In addition, the 0.65 or lower Al fraction was chosen to minimize oxidation problems that would occur with AlSb.

The heavily n-type doped $In_{0.27}Ga_{0.73}Sb$ is used as a contact layer to connect the bottom of the p-n mesa to the bottom ohmic contact metallization pad. In FIG. 4 the bottom ohmic contact pad is on the $In_{0.69}Al_{0.31}As_{0.41}Sb_{0.59}$ layer to the right of the mesa. $In_{0.27}Ga_{0.73}Sb$ is used as the contact layer in FIG. 6 to minimize the parasitic resistance of this layer. This comes about as it has a mobility of 4500 $cm^2/Vs$ compared to about 2500 $cm^2/Vs$ for the $In_{0.69}Al_{0.31}As_{0.41}Sb_{0.59}$ used in FIG. 3. In addition, it is much easier to grow $In_{0.27}Ga_{0.73}Sb$ than $In_{0.69}Al_{0.31}As_{0.41}Sb_{0.59}$. The SI—InP was used as it is frequently used in modern semiconductor electronics and to demonstrate that the p-n heterojunction could be made on it.

Example

Another embodiment includes a device with a substrate wherein the substrate is GaAs or InP, wherein the substrate is undoped, a GaAs layer on the substrate, wherein the GaAs layer is undoped, an $Al_{0.65}Ga_{0.35}Sb$ layer on the GaAs layer, wherein the $Al_{0.65}Ga_{0.35}Sb$ layer is undoped, an $In_{0.19}Ga_{0.19}Al_{0.62}Sb$ layer on the $Al_{0.65}Ga_{0.35}Sb$, wherein the $In_{0.19}Ga_{0.19}Al_{0.62}Sb$ layer is undoped, an $InAs_{0.66}Sb_{0.34}$ layer on the $In_{0.19}Ga_{0.19}Al_{0.62}Sb$, wherein the $InAs_{0.66}Sb_{0.34}$ layer is Te doped, an $In_{0.69}Al_{0.31}As_{0.41}Sb_{0.59}$ layer with a top side and a bottom side, wherein the bottom side is on the $InAs_{0.66}Sb_{0.34}$ layer and wherein the $In_{0.69}Al_{0.31}As_{0.41}Sb_{0.59}$ comprises varying levels of Te doping, and a $In_zGa_{1-z}Sb$ layer on the $In_{0.69}Al_{0.31}As_{0.41}Sb_{0.59}$ layer, wherein the $In_zGa_{1-z}Sb$ layer is doped with Be.

The device as outlined above can be such that the $InAs_{0.66}Sb_{0.34}$ layer is from about 0.1μ to about 1.0μ thick and in particular about 0.5μ thick and wherein the $InAs_{0.66}Sb_{0.34}$ layer has about $1.5 \times 10^{18}$ Te $cm^{-3}$ to about $3.0 \times 10^{18}$ Te $cm^{-3}$ and in particular about $2.5 \times 10^{18}$ Te $cm^{-3}$.

The device can be such that the $In_{0.69}Al_{0.31}As_{0.41}Sb_{0.59}$ layer is about 75 nm to about 300 nm thick and in particular about 140 nm thick and comprises a first section of about 3 nm to about 50 nm and in particular about 10 nm from the bottom side, a second section of about 10 nm to about 100 nm and in particular about 30 nm from the first section; and a third section of about 50 nm to about 200 nm and in particular about 100 nm from the second section, wherein the first section of about 3 nm to about 50 nm and in particular about 10 nm of the $In_{0.69}Al_{0.31}As_{0.41}Sb_{0.59}$ layer from the bottom side has Te doping and in particular about $6.4 \times 10^{18}$ Te cm$^{-3}$, wherein the second section of about 10 nm to about 100 nm and in particular about 30 nm of the $In_{0.69}Al_{0.31}As_{0.41}Sb_{0.59}$ layer from the first section has a grade in Te concentration, and wherein the third section of about 100 nm of the $In_{0.69}Al_{0.31}As_{0.41}Sb_{0.59}$ layer from the second section has about $2 \times 10^{17}$ Te cm$^{-3}$.

The device can be such that the $In_zGa_{1-z}Sb$ layer is about 20 nm to about 200 nm and particular about 50 nm thick.

The device can be such that the $In_zGa_{1-z}Sb$ layer has varying amounts of Be doping and in particular about $1 \times 10^{19}$ Be cm$^{-3}$.

The device can be such that the $Al_{0.65}Ga_{0.35}Sb$ layer has a lattice constant of 6.12 Å and wherein the GaAs substrate has a lattice constant of 5.653 Å and wherein the, $In_{0.19}Ga_{0.19}Al_{0.62}Sb$, $InAs_{0.66}Sb_{0.34}$, $In_{0.69}Al_{0.31}As_{0.41}Sb_{0.59}$ and $In_zGa_{1-z}Sb$ layers have a lattice constant of 6.2 Å.

The device can be such that it can be used as a mixer at RF frequencies extending from about 20 GHz to about 2 THz frequency range.

The device can be such that the device can be used as a mixer at RF frequencies of about 2 THz.

The device can be such that the bandgap of the $In_zGa_{1-z}Sb$ alloy decreases as the indium fraction increases from z=0.27.

The device can further include a mesa ohmic contact on the $In_{0.27}Ga_{0.73}Sb$ layer; and a bottom ohmic contact on the $InAs_{0.66}Sb_{0.34}$ layer.

A method of making a p-n junction for use as an RF mixer from GHz to THz frequencies by providing a GaAs substrate, wherein the GaAs substrate is undoped. growing by solid source molecular beam epitaxy a GaAs layer on the GaAs substrate, wherein the GaAs is undoped, growing by solid source molecular beam epitaxy a $Al_{0.65}Ga_{0.35}Sb$ layer on the GaAs, wherein the $Al_{0.65}Ga_{0.35}Sb$ layer is undoped, growing an by solid source molecular beam epitaxy $In_{0.19}Ga_{0.19}Al_{0.62}Sb$ layer on the $Al_{0.65}Ga_{0.35}Sb$, wherein the $In_{0.19}Ga_{0.19}Al_{0.62}Sb$ layer is undoped, growing by solid source molecular beam epitaxy an $InAs_{0.66}Sb_{0.34}$ layer, wherein the $InAs_{0.66}Sb_{0.34}$ layer is Te doped, growing by solid source molecular beam epitaxy a $In_{0.69}Al_{0.31}As_{0.41}Sb_{0.59}$ layer with a top side and a bottom side, wherein the bottom side is on the $InAs_{0.66}Sb_{0.34}$ layer and wherein the $In_{0.69}Al_{0.31}As_{0.41}Sb_{0.59}$ comprises varying levels of Te doping, growing a $In_{0.27}Ga_{0.73}Sb$ layer on the $In_{0.69}Al_{0.31}As_{0.41}Sb_{0.59}$ layer, wherein the $In_{0.27}Ga_{0.73}Sb$ layer is doped with Be.

Commercially available mixers are generally Schottky barriers on GaAs or Si. The Si devices operate at frequencies of 40 GHz or lower which is well below the frequency range of the application we are addressing. GaAs diodes do operate at frequencies in the THz but they require several mW of local oscillator power when a DC bias is not used.

The saturation current density of a diode is a measure of the LO power that will be required. Mixer diodes with a large saturation current density will need less LO power than a mixer with low saturation current density. The mixer diode here has a saturation density $\sim 1 \times 10^{-2}$ A/cm$^2$ compared to $<10^{-6}$ A/cm$^2$ for GaAs Schottky mixer diodes in support of the claim to a lower LO power for the mixer reported here.

Reducing parasitic series resistances will lead to additional reductions in LO power, and to higher frequency operation. Alternatively, to attain the desired cutoff frequency the lower resistances will allow the use of devices with larger areas leading to higher capacitances. Using larger area devices means using simpler lithography techniques in the device fabrication.

The narrow bandgap materials used in this diode generally have higher mobilities than GaAs leading to smaller parasitic series resistances for a given geometry. Comparisons between GaAs Schottky diodes and the ones presented here is problematic because of the uncertainties in proprietary commercial device geometry, but comparisons can be estimated on the basis of Hall Effect data.

Figure 8:
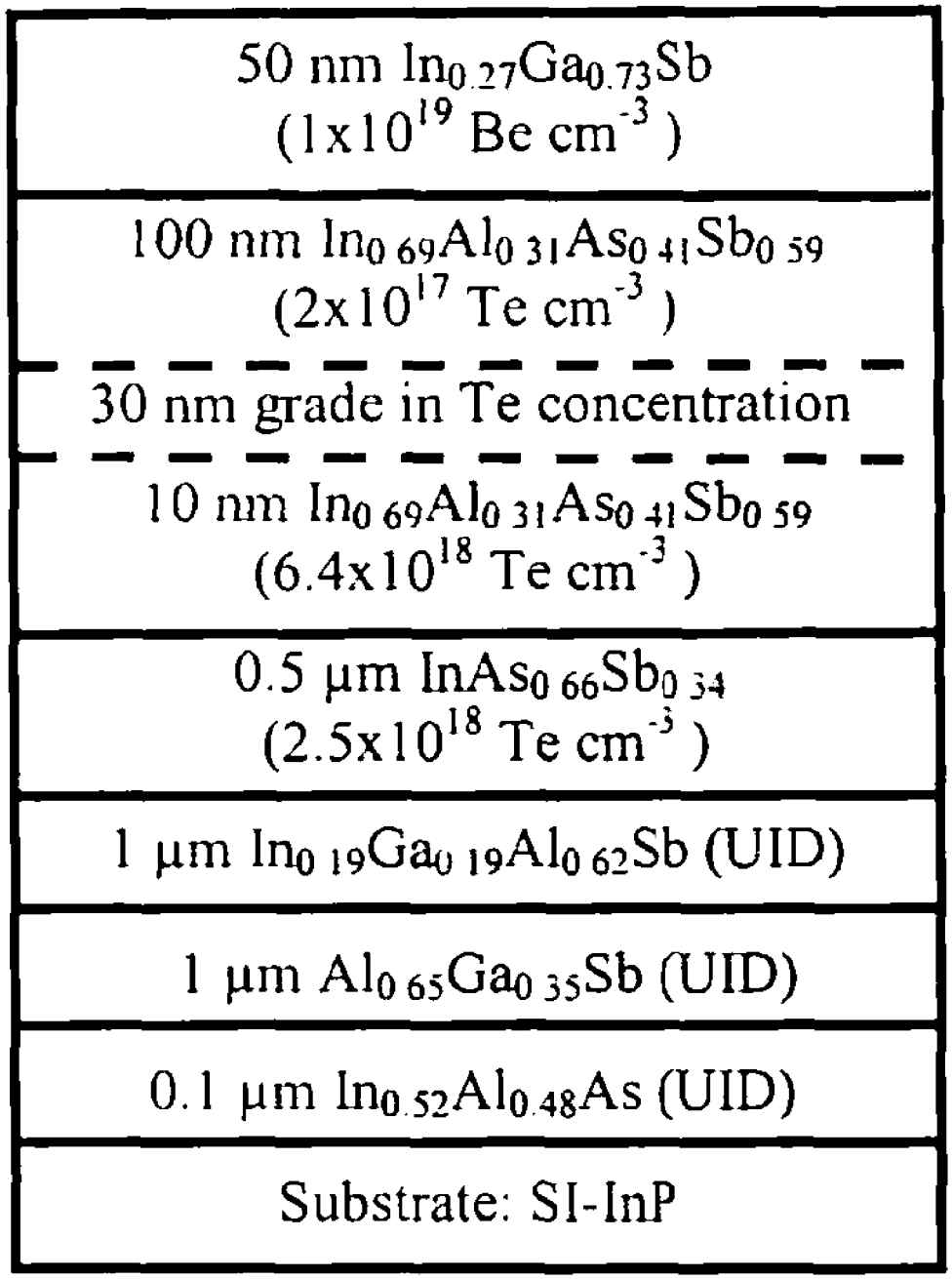
FIG. 8 illustrates an improved diode layer structure with SI—InP substrate.

The n-type $In_{0.27}Ga_{0.73}Sb$ used for the contact layer in FIG. 6 has a carrier concentration of $2.5 \times 10^{18}$ cm$^{-3}$ and mobility of $4.4 \times 10^3$ cm$^2$/Volt-sec while GaAs with the same carrier concentration has a mobility of only $2 \times 10^3$ cm$^2$/Volt-sec.[3] The advanced structures in FIGS. 8 and 9 below use $InAs_{0.64}Sb_{0.36}$ for this layer and it has an even higher mobility of $5.5 \times 10^3$ cm$^2$/Volt-sec.

For the diode geometry used here, the mesa resistance is not the dominant resistance, which limits the impact of the $In_{0.69}Al_{0.31}As_{0.41}Sb_{0.59}$ layer having a mobility near $2.5 \times 10^3$ cm$^2$/Volt-sec that is lower than that for GaAs at the same carrier concentration.

A number of improvements can be made to the layer structure in FIG. 3. GaSb substrates are conducting and are not useable for circuit applications. Semi-insulating substrates are required for circuit applications where devices need to be electrically isolated.

Figure 7:
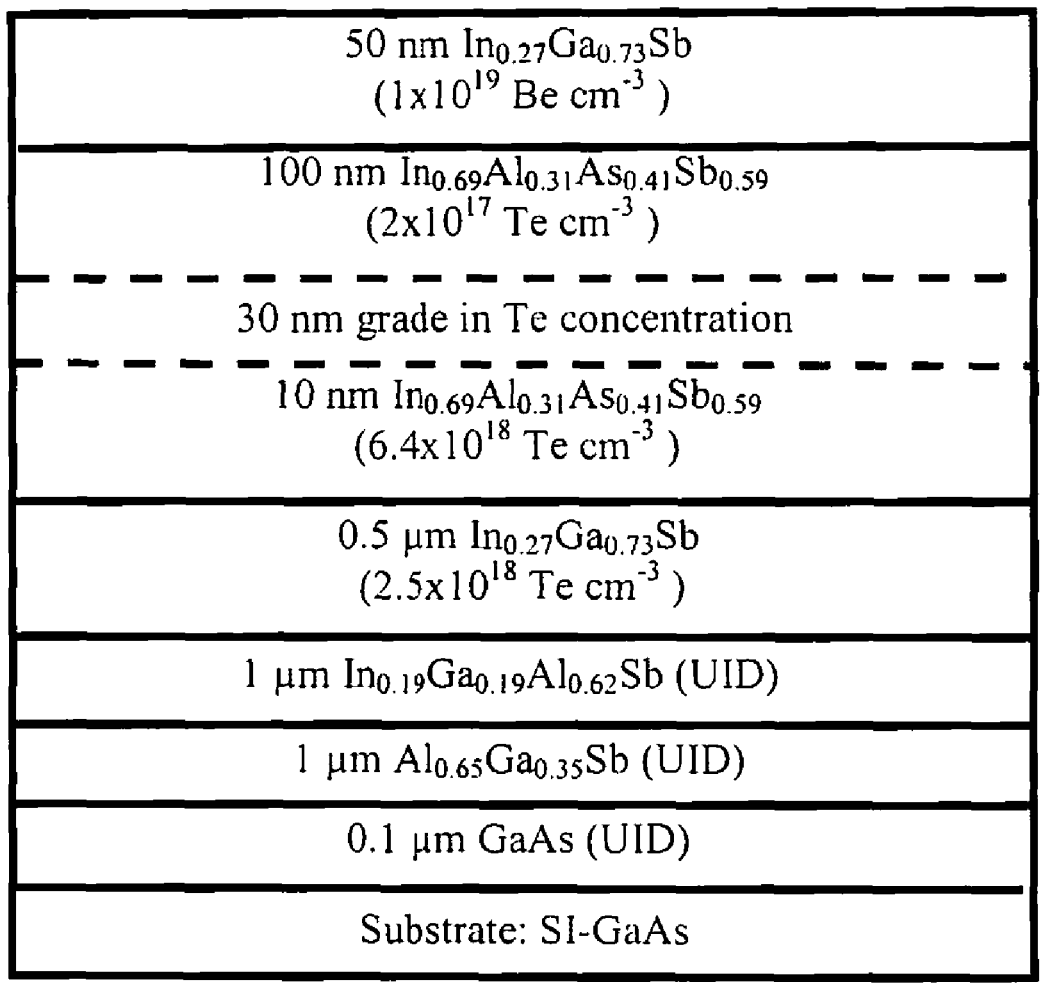
FIG. 7 illustrates an improved diode layer structure with SI—GaAs substrate.

Mixer diodes have been successfully grown by our group on both semi-insulating InP, illustrated in FIG. 6, and on SI GaAs as shown in FIG. 7. The thicknesses of the various layers can be optimized to reduce the parasitic series resistances in order to increase the cutoff frequency.

The thickness of the p-type $In_{0.27}Ga_{0.73}Sb$ has been reduced to 50 nm and the doping increased to $1 \times 10^{19}$ Be cm$^{-3}$ to reduce the p layer resistance to one tenth that of the structure in FIG. 3.

The 1.2 μm thick $In_{0.69}Al_{0.31}As_{0.41}Sb_{0.59}$ layer has been replaced by a 140 nm $In_{0.69}Al_{0.31}As_{0.41}Sb_{0.59}$ layer doped at $2 \times 10^{17}$ Te cm$^{-3}$ near the junction.

The combined effect of these changes is a reduction of the resistance of the $In_{0.69}Al_{0.31}As_{0.41}Sb_{0.59}$ by a factor of forty.

The resistance between the bottom ohmic contact and the p-n layers has been reduced by about 60 by using a 0.5 μm $In_{0.27}Ga_{0.73}Sb$ doped to have an electron concentration of $2.5 \times 10^{18}$ cm$^{-3}$. The improvements come from the higher doping and the higher mobility, 4400 cm$^2$/Vs, for the $In_{0.27}Ga_{0.73}Sb$, compared to 2500 cm$^2$/Vs for the $In_{0.69}Al_{0.31}As_{0.41}Sb_{0.59}$.

Additional improvements can be obtained by replacing the 0.5 μm n-type $In_{0.27}Ga_{0.73}Sb$ with a 0.5 μm $InAs_{0.66}Sb_{0.34}$ $2.5 \times 10^{18}$ Te cm$^{-3}$ layer. This can be done as shown in FIGS. 8 and 9 for both GaAs and InP substrates. $InAs_{0.66}Sb_{0.34}$ doped at this level has a mobility near 5500 cm$^2$/Vs that is higher than that of $In_{0.27}Ga_{0.73}Sb$ leading to a reduction in resistance.

The smaller bandgap of the $InAs_{0.66}Sb_{0.34}$. 0.15 eV compared to 0.5 eV for the $In_{0.27}Ga_{0.73}Sb$, will result in a smaller metal-semiconductor contact resistance which helps to reduce the parasitic series resistance and improve the frequency response.

The LO power required may be reduced by developing mixer diodes with a higher In fraction in the p-type InGaSb layer. These alloys will have a lattice constant larger than the 6.2 Å for the $In_{0.27}Ga_{0.73}Sb$ alloy and may require replacing the $In_{0.69}Al_{0.31}As_{0.41}Sb_{0.59}$ layer and the InGaSb contact layer with new alloys with a higher In fraction. These alloys would have lower resistances than those used here resulting in an even higher cutoff frequency.

Figure 9:
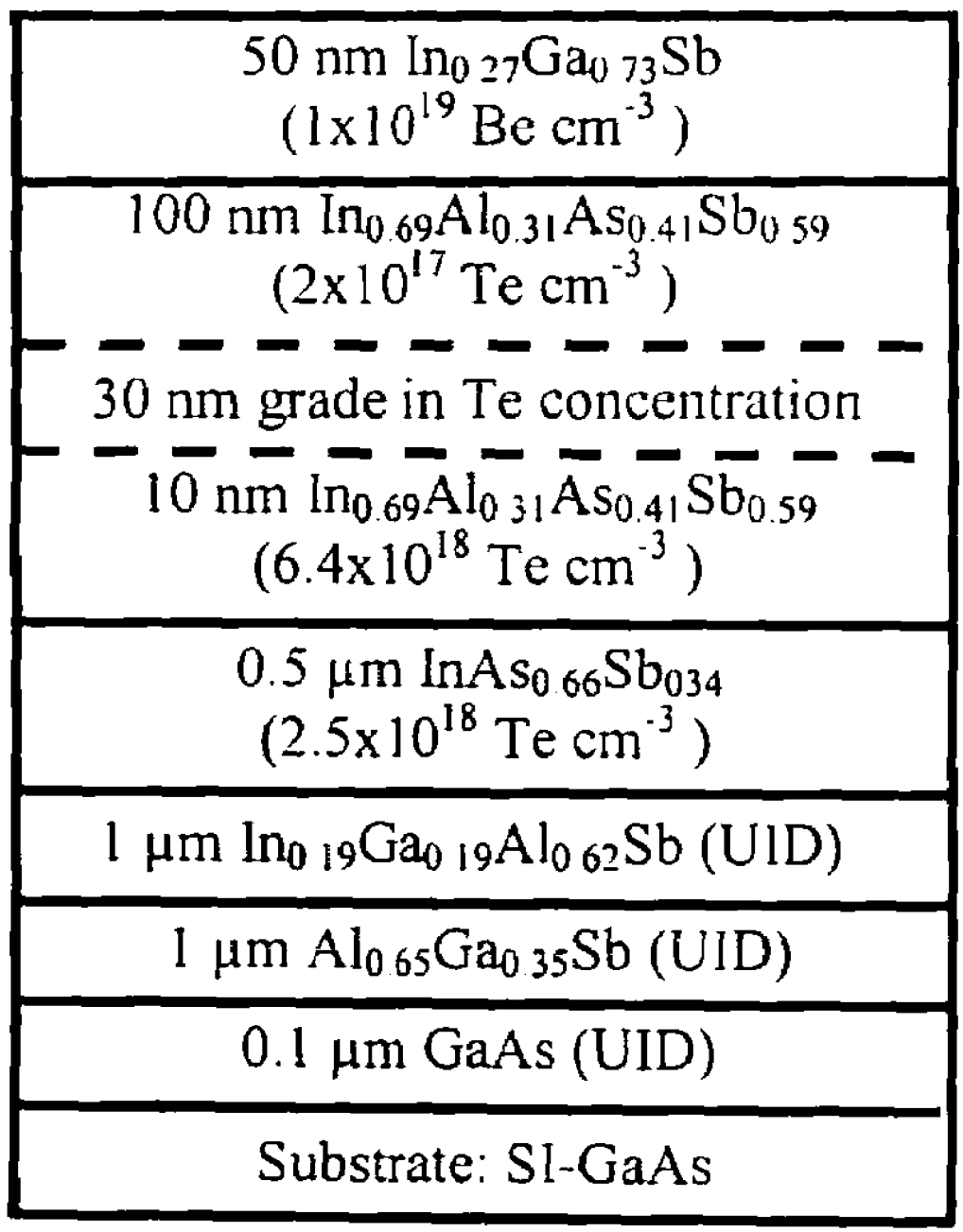
FIG. 9 illustrates an improved diode layer structure with SI—GaAs substrate.
Figure 10:
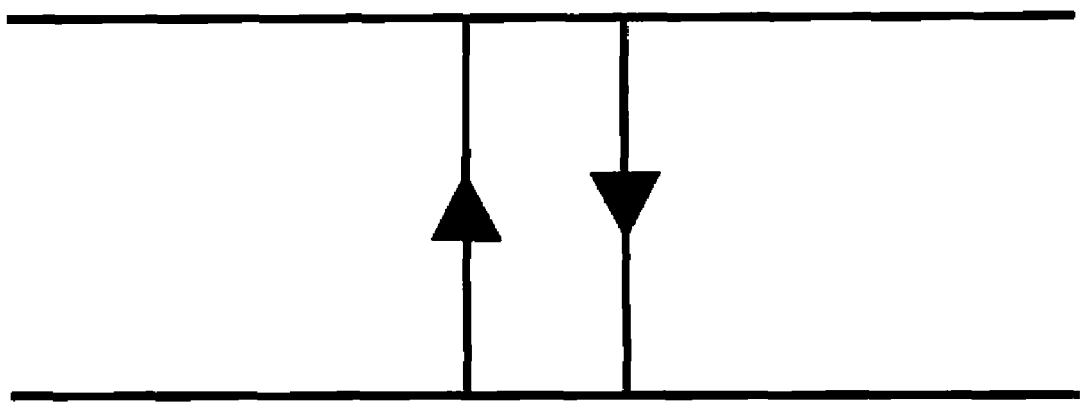
FIG. 10 illustrates an antiparallel diode pair.

This new p-n mixer can be used in the antiparallel pair configuration illustrated in FIG. 9. This geometry is often used in subharmonic mixer applications.

The foregoing written specification is considered to be sufficient to enable one skilled in the art to practice the invention. The foregoing description details certain preferred embodiments and describes the best mode contemplated by the inventors. It will be appreciated, however, that no matter how detailed the foregoing may appear in text, the present embodiments may be practiced in many ways and should be construed in accordance with the appended claims and any equivalents thereof.

What is claimed is:

1. A device comprising:
   a GaSb substrate,
      wherein the GaSb substrate is undoped;
   a AlSb layer on the GaSb substrate,
      wherein the AlSb layer is undoped;
   a $In_{0.69}Al_{0.31}As_{0.41}Sb_{0.59}$ layer with a top side and a bottom side,
      wherein the bottom side is on the AlSb layer and wherein the $In_{0.69}Al_{0.31}As_{0.41}Sb_{0.59}$ comprises varying levels of Te doping; and a $In_{0.27}Ga_{0.73}Sb$ layer on the $In_{0.69}Al_{0.31}As_{0.41}Sb_{0.59}$ layer,
      wherein the $In_{0.27}Ga_{0.73}Sb$ layer is doped with Be;
   wherein the $In_{0.69}Al_{0.31}As_{0.41}Sb_{0.59}$ layer is about 1.2 μm thick and consists of
   a first section of about 0.1 μm from the bottom side;
   a second section of about 0.1 μm from the first section; and
   a third section of about 1 μm from the second section;
      wherein the first section of about 0.1 μm of the $In_{0.69}Al_{0.31}As_{0.41}Sb_{0.59}$ layer from the bottom side has about $1.3 \times 10^{17}$ Te $cm^{-3}$;
      wherein the second section of about 0.1 μm of the $In_{0.69}Al_{0.31}As_{0.41}Sb_{0.59}$ layer from the first section has a grade in Te concentration; and
      wherein the third section of about 1 μm of the $In_{0.69}Al_{0.31}As_{0.41}Sb_{0.59}$ layer from the second section has about $4 \times 10^{16}$ Te $cm^{-3}$.

2. The device of claim 1 wherein the $In_{0.27}Ga_{0.73}Sb$ layer is about 200 nm thick and
   wherein the $In_{0.27}Ga_{0.73}Sb$ layer has about $3 \times 10^{18}$ Be $cm^{-3}$.

3. The device of claim 2 wherein the ideality factor is near 1 and the saturation current density is about $2.5 \times 10^{-2}$ A/$cm^2$.

4. The device of claim 3 wherein the AlSb layer has a lattice constant of 6.1355 Å and wherein the GaSb substrate has a lattice constant of 6.0954 Å.

5. The device of claim 4 wherein the $In_{0.69}Al_{0.31}As_{0.41}Sb_{0.59}$ and $In_{0.27}Ga_{0.73}Sb$ layers have a lattice constant of 6.2 Å.

6. The device of claim 5 wherein the device can be used as a mixer at RF frequencies extending from a few tens of GHz into the THz frequency range.

7. The device of claim 6 wherein the device can be used as a mixer at RF frequencies of about 1 THz.

8. The device of claim 1 wherein the $In_{0.27}Ga_{0.73}Sb$ layer has a bandgap of 0.5 eV.

9. The device of claim 1 wherein a larger saturation current density can be obtained by increasing the In concentration in the $In_{0.69}Al_{0.31}As_{0.41}Sb_{0.59}$ layer to obtain a smaller bandgap.

10. The device of claim 1 further including
    a mesa ohmic contact on the $In_{0.27}Ga_{0.73}Sb$ layer; and
    a bottom ohmic contact on the $In_{0.69}Al_{0.31}As_{0.41}Sb_{0.59}$ layer.

11. A device comprising:
    a substrate wherein the substrate is GaAs or InP,
       wherein the substrate is undoped;
    a GaAs layer on the substrate,
       wherein the GaAs layer is undoped;
    an $Al_{0.65}Ga_{0.35}Sb$ layer on the GaAs layer,
       wherein the $Al_{0.65}Ga_{0.35}Sb$ layer is undoped;
    an $In_{0.19}Ga_{0.19}Al_{0.62}Sb$ layer on the $Al_{0.65}Ga_{0.35}Sb$,
       wherein the $In_{0.19}Ga_{0.19}Al_{0.62}Sb$ layer is undoped;
    an $InAs_{0.66}Sb_{0.34}$ layer on the $In_{0.19}Ga_{0.19}Al_{0.62}Sb$,
       wherein the $InAs_{0.66}Sb_{0.34}$ layer is Te doped;
    an $In_{0.69}Al_{0.31}As_{0.41}Sb_{0.59}$ layer with a top side and a bottom side,
       wherein the bottom side is on the $InAs_{0.66}Sb_{0.34}$ layer and wherein the $In_{0.69}Al_{0.31}As_{0.41}Sb_{0.59}$ comprises varying levels of Te doping; and
    a $In_zGa_{1-z}Sb$ layer on the $In_{0.69}Al_{0.31}As_{0.41}Sb_{0.59}$ layer,
       wherein the $In_zGa_{1-z}Sb$ layer is doped with Be and wherein z=0.27.

12. The device of claim 11 wherein the $InAs_{0.66}Sb_{0.34}$ layer is about 0.5μ thick.

13. The device of claim 11 wherein the $InAs_{0.66}Sb_{0.34}$ layer has about $2.5 \times 10^{18}$ Te $cm^{-3}$.

14. The device of claim 11 wherein the $In_{0.69}Al_{0.31}As_{0.41}Sb_{0.59}$ layer is about 140 nm thick and comprises
    a first section of about 10 nm from the bottom side;
    a second section of about 30 nm from the first section; and
    a third section of about 100 nm from the second section;
       wherein the first section of about 10 nm of the $In_{0.69}Al_{0.31}As_{0.41}Sb_{0.59}$ layer from the bottom side has about $6.4 \times 10^{18}$ Te $cm^{-3}$;
       wherein the second section of about 30 nm of the $In_{0.69}Al_{0.31}As_{0.41}Sb_{0.59}$ layer from the first section has a grade in Te concentration; and
       wherein the third section of about 100 nm of the $In_{0.69}Al_{0.31}As_{0.41}Sb_{0.59}$ layer from the second section has about $2 \times 10^{17}$ Te $cm^{-3}$.

15. The device of claim 11 wherein the $In_zGa_{1-z}Sb$ layer is about 50 nm thick.

16. The device of claim 11 wherein the $In_zGa_{1-z}Sb$ layer has about $1 \times 10^{19}$ Be $cm^{-3}$.

17. The device of claim 11 wherein the $Al_{0.65}Ga_{0.35}Sb$ layer has a lattice constant of 6.12 Å and wherein the GaAs substrate has a lattice constant of 5.653 Å and wherein the, $In_{0.19}Ga_{0.19}$ $Al_{0.62}Sb$, $InAs_{0.66}Sb_034$, $In0_{0.69}Al_{0.31}As_{0.41}Sb_{0.59}$ and $In_zGa_{1-z}Sb$ layers have a lattice constant of 6.2 Å.

18. The device of claim 11 wherein the device can be used as a mixer at RF frequencies extending from about 20 GHz to about 2 THz frequency range.

19. The device of claim 11 wherein the device can be used as a mixer at RF frequencies of about 2 THz.

20. The device of claim 11 wherein the bandgap of the $In_zGa_{1-z}Sb$ alloy decreases as the indium fraction increases from z=0.27.

21. The device of claim 11 further including
    a mesa ohmic contact on the $In_{0.27}Ga_{0.73}Sb$ layer; and
    a bottom ohmic contact on the $InAs_{0.66}Sb_034$ layer.

22. A method of making a p-n junction for use as an RF mixer from GHz to THz frequencies comprising:
    providing a GaAs substrate,
       wherein the GaAs substrate is undoped;
    growing by solid source molecular beam epitaxy a GaAs layer on the GaAs substrate,
       wherein the GaAs is undoped;

growing by solid source molecular beam epitaxy a Al$_{0.65}$Ga$_{0.35}$Sb layer on the GaAs, wherein the Al$_{0.65}$Ga$_{0.35}$Sb layer is undoped;

growing an by solid source molecular beam epitaxy In$_{0.19}$Ga$_{0.19}$Al$_{0.62}$Sb layer on the Al$_{0.65}$Ga$_{0.35}$Sb wherein the In$_{0.19}$Ga$_{0.19}$Al$_{0.62}$Sb layer is undoped;

growing by solid source molecular beam epitaxy an InAs$_{0.66}$Sb$_{0.34}$ layer, wherein the InAs$_{0.66}$Sb$_{0.34}$ layer is Te doped;

growing by solid source molecular beam epitaxy a In$_{0.69}$Al$_{0.31}$As$_{0.41}$Sb$_{0.59}$ layer with a top side and a bottom side, wherein the bottom side is on the InAs$_{0.66}$Sb$_{0.34}$ layer and wherein the In$_{0.69}$Al$_{0.31}$As$_{0.41}$Sb$_{0.59}$ comprises varying levels of Te doping;

growing a In$_{0.27}$Ga$_{0.73}$Sb layer on the In$_{0.69}$Al$_{0.31}$As$_{0.41}$Sb$_{0.59}$ layer, wherein the In$_{0.27}$Ga$_{0.73}$Sb layer is doped with Be.

* * * * *